United States Patent
Shappir et al.

(10) Patent No.: US 12,334,176 B2
(45) Date of Patent: Jun. 17, 2025

(54) IDENTIFYING UNUSABLE MEMORY BLOCKS BASED ON ZEROS-ONES IMBALANCE IN MEMORY READOUTS

(71) Applicant: APPLE INC., Cupertino, CA (US)

(72) Inventors: Assaf Shappir, Ganey Tikva (IL); Ruby Mizrahi, Tel Mond (IL); Nir Tishbi, Kfar Saba (IL); Itamar Atiya, Kiryat Tivon (IL)

(73) Assignee: Apple Inc., Cupertino, CA (US)

( * ) Notice: Subject to any disclaimer, the term of this patent is extended or adjusted under 35 U.S.C. 154(b) by 207 days.

(21) Appl. No.: 18/340,906

(22) Filed: Jun. 26, 2023

(65) Prior Publication Data

US 2024/0428877 A1    Dec. 26, 2024

(51) Int. Cl.
*G11C 29/52* (2006.01)
*G11C 16/08* (2006.01)
*G11C 16/26* (2006.01)
*G11C 16/34* (2006.01)

(52) U.S. Cl.
CPC .............. *G11C 29/52* (2013.01); *G11C 16/08* (2013.01); *G11C 16/26* (2013.01); *G11C 16/3495* (2013.01)

(58) Field of Classification Search
CPC ......... G11C 29/52; G11C 16/08; G11C 16/26; G11C 16/3495
See application file for complete search history.

(56) References Cited

U.S. PATENT DOCUMENTS

| | | | |
|---|---|---|---|
| 8,767,467 B2 | 7/2014 | Parat et al. | |
| 2015/0243363 A1* | 8/2015 | Wu | G11C 29/52 365/185.18 |
| 2021/0312057 A1* | 10/2021 | Kloth | G06F 21/575 |

OTHER PUBLICATIONS

Zheng et al., "Joint Decoding of RAID-ECC Solutions for SSDs" Conference Paper, 55th Annual Allerton Conference on Communication, Control, and Computing, IEEE, pp. 429-436, year 2017.
Sharon et al., "Leveraging RAID for Soft BCH Decoding," Conference Paper, 10th Annual Non-Volatile Memories Workshop (NVMW), pp. 1-2, year 2019.

* cited by examiner

*Primary Examiner* — Han Yang
(74) *Attorney, Agent, or Firm* — Meitar Patents Ltd.; Daniel Kligler

(57) ABSTRACT

A storage apparatus includes an interface and storage circuitry. The interface is configured to communicate with a plurality of memory cells organized in multiple memory blocks. The storage circuitry is configured to produce a given readout by reading data from a group of the memory cells in a given memory block, using a given read voltage, to calculate a given zeros-ones imbalance level of the given readout, based on the given zeros-ones imbalance level, to check whether the given readout level is zeros-ones balanced or unbalanced in accordance with a balance criterion, and upon detecting that the given readout is zeros-ones unbalanced, mark the given memory block as suspected of being unusable.

20 Claims, 2 Drawing Sheets

IDENTIFYING UNUSABLE MEMORY BLOCKS BASED ON ZEROS-ONES IMBALANCE IN MEMORY READOUTS

TECHNICAL FIELD

Embodiments described herein relate generally to data storage, and particularly to methods and systems for identifying unusable memory blocks based on zeros-ones imbalance in memory readouts.

BACKGROUND

In various types of storage devices, memory cells are organized in erasable storage units referred to as memory blocks. During the lifetime of a memory device a memory block may become unusable and should be retired.

Methods for identifying unusable memory blocks are known in the art. For example, U.S. Pat. No. 8,767,467 describes memory devices and methods, including a method involving erasing a block of memory cells. After erasing the block, and before subsequent programming of the block, a number of bad strings in the block are determined based on charge accumulation on select gate transistors. The block is retired from use if the number of bad strings exceeds a threshold.

SUMMARY

An embodiment that is described herein provides a storage apparatus that includes an interface and storage circuitry. The interface is configured to communicate with a plurality of memory cells organized in multiple memory blocks. The storage circuitry is configured to produce a given readout by reading data from a group of the memory cells in a given memory block, using a given read voltage, to calculate a given zeros-ones imbalance level of the given readout, based on the given zeros-ones imbalance level, to check whether the given readout level is zeros-ones balanced or unbalanced in accordance with a balance criterion, and upon detecting that the given readout is zeros-ones unbalanced, mark the given memory block as suspected of being unusable.

In some embodiments, the storage circuitry is configured to produce the given readout by reading the memory cells in the group using a default read voltage specified at production of a memory device including the plurality of memory cells. In other embodiments, the storage circuitry is configured to check whether the given readout is zeros-ones balanced or unbalanced after: (i) producing an initial readout by reading the memory cells in the group using a read threshold that has been determined based on one or more previous read operations from the given memory block or from other memory blocks, and (ii) determining that the initial readout is zeros-ones unbalanced. In yet other embodiments, the memory cells in the group store a Code Word (CW) of an Error Correction Code (ECC), and the storage circuitry is configured to check whether the given readout is zeros-ones balanced or unbalanced after: (i) producing an initial readout by reading the memory cells in the group using a read threshold that has been determined based on previous read operations from the given memory block or from other memory blocks, (ii) applying hard decoding of the ECC to the initial readout when the initial readout is zeros-ones balanced, and (iii) identifying that the hard decoding has failed.

In an embodiment, the memory cells in the group store a Code Word (CW) of an Error Correction Code (ECC), and the storage circuitry is configured to, upon detecting that the given readout is zeros-ones balanced, acquire an optimal read voltage, read the memory cells in the group using the acquired optimal read voltage to produce an optimal readout, calculate an optimal zeros-ones imbalance level of the optimal readout, apply soft decoding of the ECC to the optimal readout, and upon detecting that the soft decoding has failed, apply to at least part of the given memory block a Redundant Array of Independent Disks (RAID) scheme to recover the CW. In another embodiment, the storage circuitry is configured to mark the given memory block as unusable upon detecting that the RAID scheme has failed. In yet another embodiment, the storage circuitry is configured to, in response to detecting that the RAID scheme has succeeded to recover the CW, mark the given memory block as unusable upon identifying that a number of errors in the optimal readout is below a first specified error-count threshold or above a second higher specified error-count threshold.

In some embodiments, the storage circuitry is configured to, in response to detecting that the RAID scheme has succeeded to recover the CW, mark the given memory block as unusable upon detecting, based on the optimal zeros-ones imbalance level, that the optimal readout is zeros-ones unbalanced. In other embodiments, the storage circuitry is configured to, in response to detecting that the RAID scheme has succeeded to recover the CW, mark the given memory block as unusable upon detecting that an absolute difference between the given zeros-ones imbalance level and the optimal zeros-ones imbalance level is higher than a difference threshold that depends on an absolute difference between the given read threshold and the optimal read voltage. In yet other embodiments, the storage circuitry is configured to, in response to detecting that the RAID scheme has succeeded to recover the CW, mark the given memory block as unusable upon detecting that the RAID scheme has been invoked at least a specified number of times in multiple successive Program and Erase (P/E) cycles applied to the given memory block.

There is additionally provided, in accordance with an embodiment that is described herein, a method for data storage, including, in a storage apparatus including a plurality of memory cells organized in multiple memory blocks, producing a given readout by reading data from a group of the memory cells in a given memory block, using a given read voltage. A given zeros-ones imbalance level of the given readout is calculated. Based on the given zeros-ones imbalance level, a condition is checked whether the given readout level is zeros-ones balanced or unbalanced in accordance with a balance criterion. Upon detecting that the given readout is zeros-ones unbalanced, the given memory block is marked as suspected of being unusable.

These and other embodiments will be more fully understood from the following detailed description of the embodiments thereof, taken together with the drawings in which:

DETAILED DESCRIPTION OF EMBODIMENTS

Overview

Figure 1:
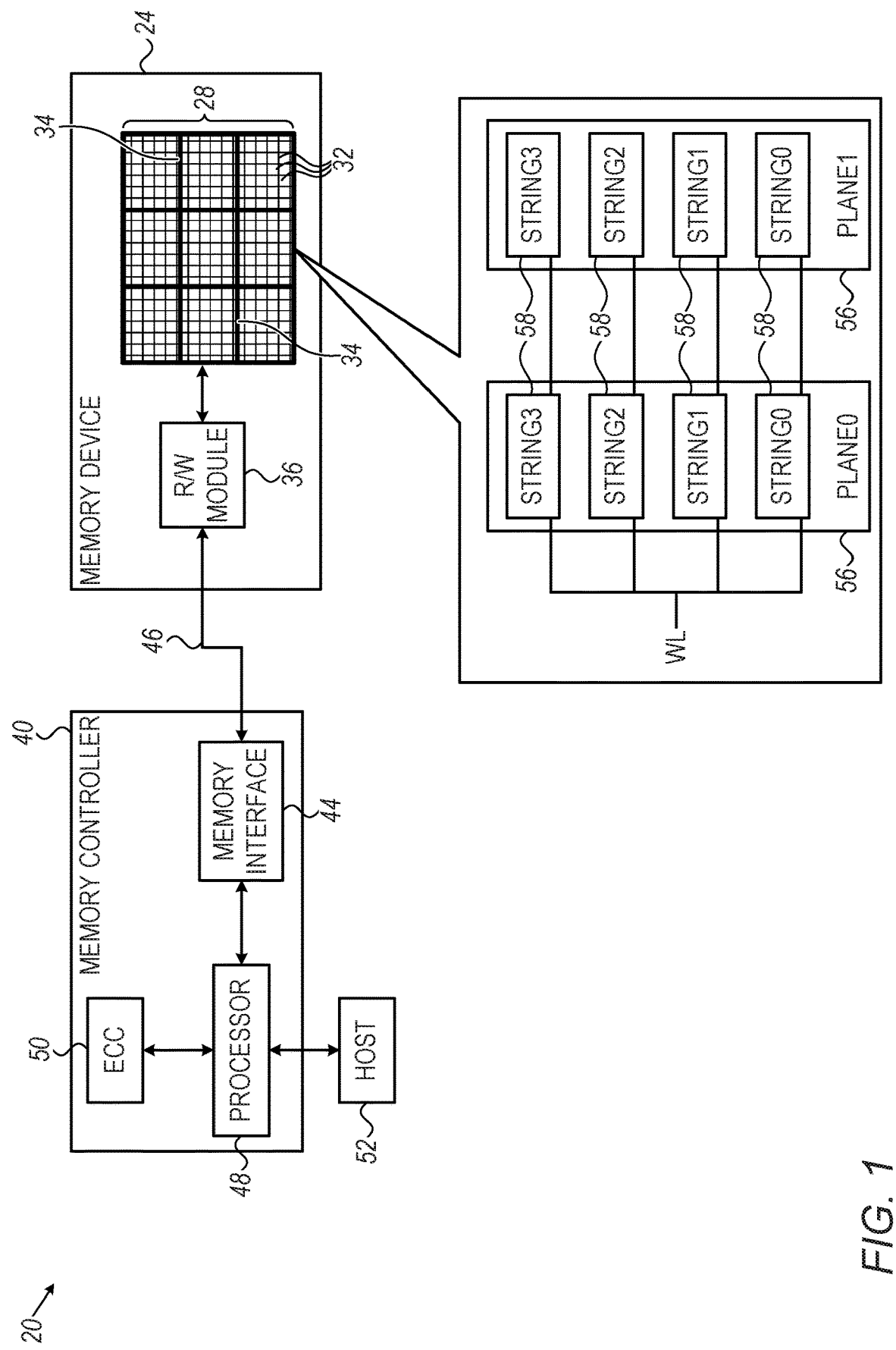
FIG. 1 is a block diagram that schematically illustrates a memory system, in accordance with an embodiment that is described herein.

Embodiments that are described herein provide improved methods and systems for identifying unusable memory blocks. Specifically, classification of memory blocks as usable or unusable is improved, compared to conventional methods, by using imbalance levels of one or more readouts in deciding on memory block usability. In the description that follows, a usable memory block is also referred to as a "good block" and an unusable memory block is also referred to as a "bad block".

Failures in memory devices such as a nonvolatile memory (e.g., a NAND Flash device) may occur for various reasons. When a failure event occurs while reading data from a memory block, the data cannot be retrieved correctly from that memory block.

Failures in reading data are sometimes classified into two major failure modes referred to as quality failures and reliability failures. Quality failures typically occur due to defects in the physical media such as shorts and opens. Such defects may be created at production or develop over the device lifetime. Reliability failures may occur due to aging, disturbance effects among memory cells and operating conditions, for example. Unlike quality failures that typically tend to be persistent, reliability failures may be resolved by applying high capability decoding methods, or after the failing block memory is erased and reprogrammed.

Methods that may be effective in mitigating quality failures typically differ from methods required in mitigating reliability failures. Methods suitable for mitigating various types of defects may include, for example, production burn-in, stress application and screening, complimented by adding redundancy (e.g., at a column and/or block level), bad block management, and Redundant Array of Independent Disks (RAID) schemes. Methods for mitigating reliability failures include, for example, built-in technology margins, applying system media management schemes (e.g., wear-leveling), and applying Error Correction Code (ECC) decoding.

In principle, a failure event, defect driven, or reliability driven, could be considered as indicating that the memory block should be designated as bad and no longer used. This approach, however, may result in wrongly identifying memory blocks having reliability failures as unusable.

Some types of defects may be manifested inconsistently, e.g., resulting in varying numbers of errors in repeated read operations from the same memory location. For example, in using certain advanced decoding schemes (e.g., soft decoding), and/or when reconstructing a memory block using a suitable RAID scheme, multiple read operations may be applied to retrieve data from a common memory location. When the numbers of errors differ across the read operations, the ability to decode or reconstruct the read data also becomes inconsistent, which may result in data loss. This may occur, e.g., in a Flash NAND device that is typically characterized by high electrical coupling between nodes, especially in a Three-Dimensional (3D) configuration. In case of an open, there is a floating node that can be coupled to other word lines and thus repeated operations (reads), or high voltage operations (program), may charge the node and the circuit would appear as operating correctly. After an idle period, however, the node would discharge, causing a subsequent operation (read) to fail.

Another cause for failure inconsistency is related to partial opens or shorts that may sporadically result in high error counts. A partial open or a weak short may result in intermittent failures of the NAND circuits, in which case failure identification may be inconsistent and again be influenced by the operation of adjacent nodes or circuits. Such failures typically depend on environmental conditions such as operating temperature and supply voltages that greatly impact floating node coupling charging and device timing.

In general, wrongly marking memory blocks as unusable may result in loss of media space and increased write amplification, both potentially leading to complete storage system failure. On the other hand, wrongly identifying memory blocks as usable may cause significant degradation in user experience due to repeated application of the underlying RAID scheme, which typically introduces long latency.

In a typical read processing sequence, a code word of a certain ECC (the code word possibly containing one or more errors) is read from a memory block to produce a readout, and a suitable ECC decoding is applied to the readout. When the ECC decoding fails, advanced decoding and other methods may be further applied, including a RAID scheme.

Identifying unusable memory blocks could be carried out using several approaches as described herein. In one approach, a memory block containing a code word that failed ECC decoding could be retired as unusable regardless of whether the code word is recoverable using RAID. This approach may prevent repeated failures from the same physical address (due to defects) and therefore lowers the risk of data loss in case of exceeding the reconstruction capability of the underlying RAID scheme. In case of a reliability failure, the memory block could potentially be healed and reprogramed rather than wrongly retired.

In another approach, a memory block that has been reconstructed successfully by the RAID scheme could be identified as usable, even when the memory block has defects. This approach may result in noticeable degradation to the user experience, and possibly in user data loss if the failure becomes more pronounced (beyond the reconstruction capability of the underlying RAID scheme).

In some embodiments, advanced data recovery schemes that combine ECC and RAID schemes may be used to extend the reliability envelop of the storage system. Example schemes of this sort are described, for example, in a paper entitled "Leveraging RAID for Soft BCH Decoding," presented in the $10^{th}$ annual Non-Volatile Memories Workshop (NVMW), Mar. 10-12, 2019, and in another paper entitled "Joint Decoding of RAID-ECC Solutions for SSDs" presented in the $55^{th}$ Annual Allerton Conference on Communication, Control, and Computing, Oct. 3-6, 2017. By applying a combined ECC and RAID scheme, code words read with a high number of errors due to quality failures may be recovered successfully, and therefore a memory block could be wrongly designated as usable rather than retired. As noted above, this may degrade user experience due to RAID latency.

In yet another approach, a memory block could be retired upon detecting a code word having an error count that is well above the underlying ECC capability. This approach may not work well in cases such as described above, which involve sporadic pass and fail outcomes due to partial opens or shorts, and electrical coupling between nodes.

In the disclosed embodiments, zeros-ones imbalance levels of one or more readouts from the same memory location is evaluated and used in identifying whether the underlying memory block is usable or not. Moreover, an imbalance level evaluated at an early stage of the read sequence may be used for classifying the memory block as usable or unusable, after successful reconstruction of the code word using a RAID scheme.

Consider a storage apparatus comprising an interface and storage circuitry. The interface communicates with a plurality of memory cells organized in multiple memory blocks. The storage circuitry produces a given readout by reading data from a group of the memory cells in a given memory block, using a given read voltage, calculates a given zeros-ones imbalance level of the given readout, based on the given zeros-ones imbalance level checks whether the given readout level is zeros-ones balanced or unbalanced in accordance with a balance criterion, and upon detecting that the given readout is zeros-ones unbalanced, marks the given memory block as suspected of being unusable.

In some embodiments, the storage circuitry produces the given readout by reading the memory cells in the group using a default read voltage specified at production of a memory device comprising the plurality of memory cells.

In some embodiments, the storage circuitry checks whether the given readout is zeros-ones balanced or unbalanced after: (i) producing an initial readout by reading the memory cells in the group using a read threshold that has been determined based on one or more previous read operations from the given memory block or from other memory blocks, and (ii) determining that the initial readout is zeros-ones unbalanced.

In other embodiments, the memory cells in the group store a Code Word (CW) of an Error Correction Code (ECC), and the storage circuitry checks whether the given readout is zeros-ones balanced or unbalanced after: (i) producing an initial readout, e.g., as described above, (ii) applying hard decoding of the ECC to the initial readout when the initial readout is zeros-ones balanced, and (iii) identifying that the hard decoding has failed.

When the given readout (based on the default RV) is zeros-ones balanced, the storage circuitry applies advanced decoding methods to decode or recover the CW. In an example embodiment, the storage circuitry acquires an optimal read voltage (that results in a minimal number of errors compared to other read voltages), reads the memory cells in the group using the acquired optimal read voltage to produce an optimal readout, calculates an optimal zeros-ones imbalance level of the optimal readout, applies soft decoding of the ECC to the optimal readout, and upon detecting that the soft decoding has failed, applies to at least part of the given memory block a Redundant Array of Independent Disks (RAID) scheme to recover the CW.

When the RAID scheme fails, the storage circuitry marks the given memory block as unusable. When the RAID scheme succeeds, however, the storage circuitry may classify the memory block as usable or unusable based on one or more classification criteria as described herein.

In one embodiment, when the RAID succeeds, the storage circuitry marks the given memory block as unusable upon identifying that a number of errors in the optimal readout is below a first specified error-count threshold, or above a second higher specified error-count threshold. In another embodiment, when the RAID succeeds, the storage circuitry marks the given memory block as unusable upon detecting, based on the optimal zeros-ones imbalance level, that the optimal readout is zeros-ones unbalanced. In yet another embodiment, when the RAID succeeds, the storage circuitry marks the given memory block as unusable upon detecting that an absolute difference between the given zeros-ones imbalance level and the optimal zeros-ones imbalance level is higher than a difference threshold that depends on an absolute difference between the given read threshold and the optimal read voltage. In yet further another embodiment, when the RAID succeeds, the storage circuitry marks the given memory block as unusable upon detecting that the RAID scheme has been invoked at least a specified number of times in multiple successive Program and Erase (P/E) cycles applied to the given memory block. Various combinations of one or more of the conditions above can also be used.

In the disclosed techniques, a processing chain includes measuring imbalance levels of respective readouts taken at selected respective RVs as required. The imbalance levels are used in classifying the underlying memory block as usable or unusable. Unlike conventional processing in which invoking RAID indicates that the memory block is unusable even when the RAID results in successful recovery of the code word, in the disclosed embodiments, block classification is carried out also when the code word is successfully recovered by the RAID scheme, resulting in accurate decisions on block usability that could not be achieved otherwise. For example, an extremely high error count after successful RAID is likely to occur due to a physical defect, in which case the block should be retired. Using the disclosed embodiments results in improved user experience in terms of longer availability of storage space and shorter read operation latencies. Moreover, retaining usable memory blocks that are not defective, results in reduced wear out, lower write amplification and again better system response and user experience.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory system 20 comprises a Non-Volatile Memory (NVM) device 24, which stores data in a memory array 28 that comprises multiple memory cells 32, such as analog memory cells. The memory cells are arranged in multiple memory blocks 34. In the context of the present patent application, the term "analog memory cell" is used to describe any memory cell that holds a continuous, analog value of a physical parameter, such as an electrical voltage or charge. Memory array 28 may comprise solid-state memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM) or Resistive RAM (RRAM). Although the embodiments described herein refer mainly to analog memory, the disclosed techniques may also be used with various other memory types.

The charge levels stored in the memory cells and/or the analog voltages or currents written into and read out of the memory cells are referred to herein collectively as analog values, storage values or analog storage values. Although the embodiments described herein mainly address threshold voltages, the methods and systems described herein may be used with any other suitable kind of storage values. In the description that follows, the terms "analog values" and "threshold voltages" are used interchangeably.

Memory system 20 stores data in memory cells 32 by programming the memory cells to assume respective memory states, which are also referred to as programming levels. The programming levels are selected from a finite set of possible levels, and each programming level corresponds to a certain nominal storage value. For example, a 2 bit/cell Multi-Level Cell (MLC) can be programmed to assume one of four possible programming levels by writing one of four possible nominal storage values into the cell. Similarly, a 3 bit/cell device and a 4 bit/cell device, also referred to as a Triple-Level Cell (TLC) and Quad-Level Cell (QLC), can be programmed to assume one of eight and one of sixteen possible programming levels, respectively. A memory cell that stores a single bit (i.e., using two programming levels) is also referred to as a Single-Level Cell (SLC).

Memory device 24 comprises a reading/writing (R/W) module 36, which converts data for storage in the memory device to analog storage values and writes them into memory cells 32. In alternative embodiments, the R/W module does not perform the conversion, but is provided with voltage samples, i.e., with the storage values for storage in the memory cells. When reading data out of memory array 28, R/W module 36 converts the storage values of memory cells 32 into digital samples having an integer resolution of one or more bits. Data is typically written to and read from the memory cells in data units that are referred to as data pages (or simply pages, for brevity).

For reading a data page, the R/W module typically sets one or more read thresholds, e.g., at about mid-points between adjacent nominal programming levels, and senses the threshold voltages of the memory cells relative to the read thresholds. In some embodiments, the R/W module supports setting read thresholds only within a predefined range of voltages.

Memory system 20 comprises a memory controller 40 that performs storage and retrieval of data in and out of memory device 24. Memory controller 40 comprises a memory interface 44 for communicating with memory device 24, a processor 48, and an error correction code (ECC) module 50. The memory controller communicates with the memory device via memory interface 44 over a communication link 46. Communication ink 46 may comprise any suitable link or communication bus, such as, for example, a PCIe bus.

In some embodiments, the memory controller communicates with the memory device storage commands such as erase, program and read commands. The memory controller may communicate with the memory device control commands, e.g., for configuring read thresholds. The disclosed techniques can be carried out by memory controller 40, by R/W module 36, or both. Thus, in the present context, memory controller 40 and R/W module 36 are referred to collectively as "storage circuitry" that carries out the disclosed techniques.

Memory controller 40 communicates with a host 52, for accepting data for storage in the memory device and for outputting data retrieved from the memory device. In some embodiments, ECC module 50 encodes the data for storage using a suitable ECC and decodes the ECC of data retrieved from the memory. ECC module 50 may comprise any suitable type of ECC, such as, for example, Low Density Parity Check (LDPC), Reed-Solomon (RS) or Bose-Chaudhuri-Hocquenghem (BCH), can be used. The word produced by the ECC encoder in a single encoding operation, in accordance with the rules defining the underlying code, is also referred to as a code word (CW).

Data read from a group of memory cells may contain one or more errors. The number of errors typically increases when the read threshold used for sensing the memory cells is positioned non-optimally. A read operation fails, for example, when the number of errors in the read data exceeds the ECC capabilities.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example memory system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor such as processor 48 or other element of the host system. In some embodiments, host 52 and memory controller 40 may be fabricated on the same die, or on separate dies in the same device package.

In some embodiments, processor 48 of memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such s magnetic, optical, or electronic memory.

In an example configuration of memory array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple memory pages, i.e., groups of memory cells that are programmed and read simultaneously. In a multi-bit per cell mode, a group of memory cells may store multiple data pages of multiple different respective bit-significance values.

In some embodiments, a given memory die comprises multiple memory arrays that are referred to as planes 56, and it is possible to program multiple pages into multiple respective planes in parallel. Typically, failing word lines can cause failure to word lines within the planes of a given die, but not with the planes of other dies.

In the example of FIG. 1, the memory cells are arranged in a Three-Dimensional (3D) configuration. In such embodiments, the memory cells are arranged in multiple strings 58, wherein each WL comprises memory cells of multiple different strings.

In some embodiments, memory pages are sub-divided into sectors. Data pages may be mapped to word lines in various manners. Each word line may store one or more data pages. A given data page may be stored in all the memory cells of a word line, or in a subset of the memory cells (e.g., the odd-order or even-order memory cells). To access a specific word line or data page, the memory device is provided with a respective physical address.

Erasing of the memory cells in memory array 28 is usually carried out in blocks that contain multiple memory pages. Typical memory devices may comprise thousands of erasure blocks, also referred to as "memory blocks" 34. In a typical two-dimensional (2D) two-bit-per-cell MLC device, each erasure block is on the order of 128 word lines, each comprising several tens of thousands of memory cells. Two-bit-per-cell devices having 128 word lines per erasure block that store a data page per bit-significance value would have 256 data pages per erasure block, and three-bit-per-cell devices would have 384 data pages per block. A typical three-dimensional (3D) device that stores three bits per cell may comprise, for example, 4 strings per block, wherein each string comprises several thousand layered columns that each comprises 48 layers of cell columns. Such a 3D device has 12 data pages per a physical word line, or 576 data pages per an erasure block. Alternatively, other block sizes and configurations can also be used.

Methods for Identifying Unusable Memory Blocks

Memory device 34 typically stores data that has been encoded into code words using ECC module 50. Moreover, memory controller 40 typically manipulates the data to be encoded (or the code word itself) to achieve storable code words in which the number of '0' bits is close to the number of '1' bits, e.g., the total number of bits in the code word is approximately divided in half between zero bits and one bits. A metric specifying an amount of deviation by which the numbers of zero bits and one bits differ from one another is referred to herein as a "zeros-ones imbalance level" or just "imbalance level" for brevity. In general, a high (or low) imbalance level corresponds to a large (or small) deviation between the numbers of '0' bits and '1' bits.

Imbalance levels may be measured in various manners. For example, let N0 and N1 denote the respective numbers of '0' bits and '1' bits in a binary vector. The imbalance level of that vector may be evaluated by calculating the ratio N0/(N0+N1) or N1/(N0+N1). In percentage notation, extreme imbalance levels may correspond to 50% and 100%. At 50% imbalance level N1=N0, in which case the binary vector is exactly balanced. At a 100% imbalance level, the binary vector contains all '0' bits or all '1' bits.

As noted above, the code words stored are well balanced (N0~N1). A readout corresponding to a well-balanced code word may, however, be highly imbalanced (N1>>N0 or N1<<N0). A highly imbalanced readout of a code word may be indicative of a large number of errors in the read code word, even beyond the decoding capabilities of the underlying ECC decoder. A large number of errors may be caused by quality failures, reliability failures, environmental conditions, and the like, as explained above. It is assumed, however, that extreme imbalance is mostly related to quality failures (physical defects). Extreme imbalance may also occur due to mistakenly or purposely reading a WL that is either erased or wasn't reprogrammed after arriving from the factory (which can result in an all-ones page).

In the disclosed embodiments, an imbalance level of a readout is evaluated and used in deciding on whether a memory block should be classified as usable (e.g., the block may be healed by reprogramming) or unusable (e.g., the block contains uncorrectable defects). The imbalance levels may be evaluated for one or more readouts that were produced by reading the same memory location using respective Read Voltages (RVs). Moreover, one or more decoding and recovery methods may be applied to the readouts such as hard decoding, acquiring of an optimal RV, soft decoding, and applying a RAID scheme.

Figure 2:
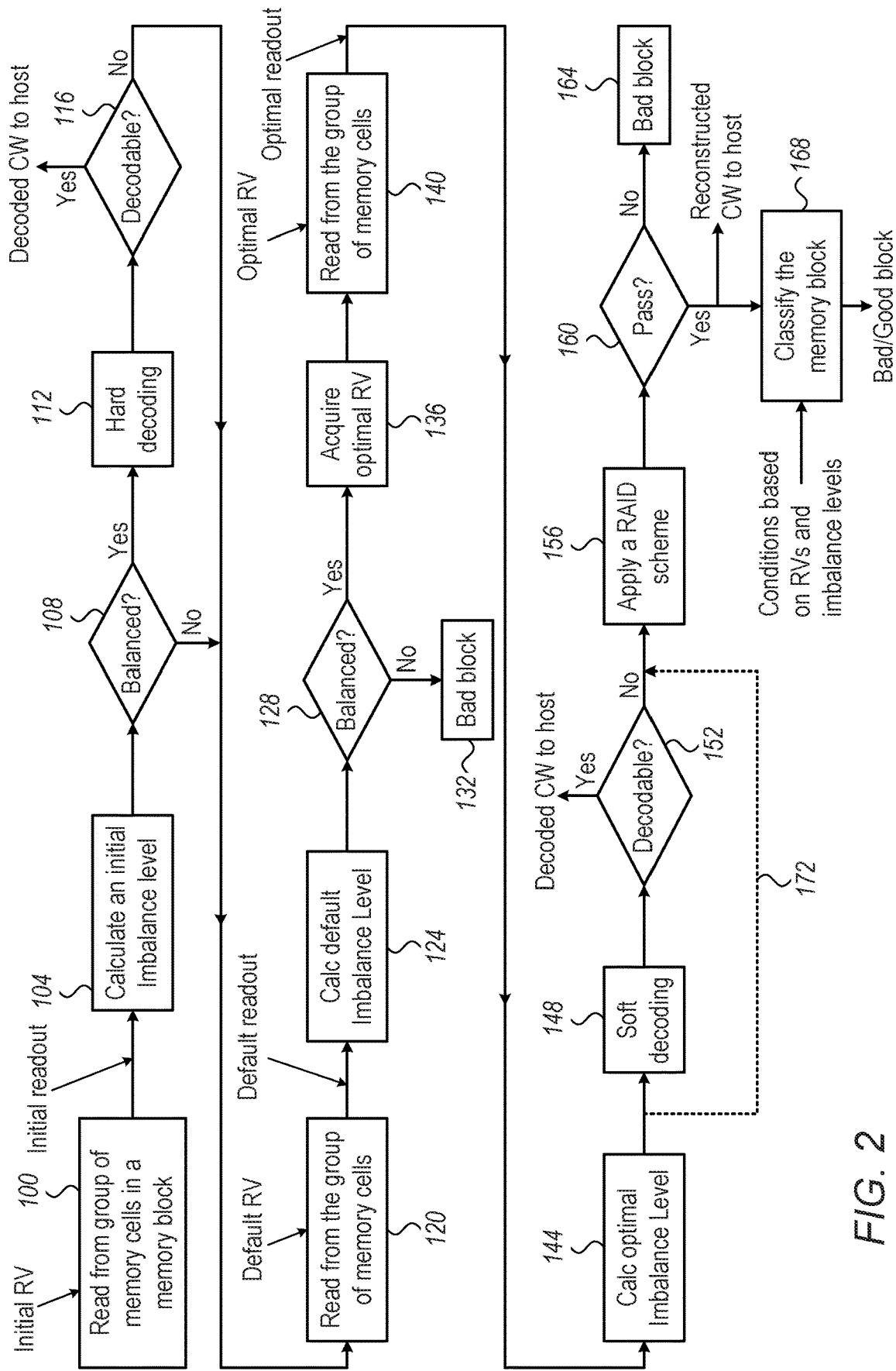
FIG. 2 is a flow chart that schematically illustrates a method for identifying unusable memory blocks, based on zeros-ones imbalance in memory readouts, in accordance with an embodiment that is described herein.

FIG. 2 is a flow chart that schematically illustrates a method for identifying unusable memory blocks, based on zeros-ones imbalance in memory readouts, in accordance with an embodiment that is described herein.

The method will be described as executed by memory controller 40 and R/W module 36 of FIG. 1. In performing read operations throughout the method, R/W module 36 senses the threshold voltages of a group of memory cells using a selected Read Voltage (RV) (or multiple RVs) provided by the memory controller. In describing the method, it is assumed that the underline memory block has been programmed and is therefore not expected to contain erased WLs.

The method begins with memory controller 40 reading data from a group of memory cells in a memory block to produce an initial readout, at an initial reading step 100. In the reading operation of step 100 R/W module 36 senses the threshold voltages of the memory cells using a single Read Voltage (RV) denoted "initial RV". The memory controller may have previously obtained the initial RV, for example, by adjusting the RV value over multiple read operations from the present memory block and/or other memory blocks, using any suitable read voltage adjustment method. When the memory block is programmed, the initial readout contains a code word of the underlying ECC (ECC 50), possibly containing one or more errors.

At an initial imbalance calculation step 104, the memory controller calculates an initial imbalance level of the initial readout, and at an initial balance query step 108, checks whether the initial readout is zeros-ones balanced in accordance with a suitable balance criterion. For example, the balance criterion may indicate that the initial readout is balanced when the initial imbalance level is below a specified initial balance threshold.

When at step 108 the memory controller identifies that the initial readout is balanced, the initial readout contains an error-free or erroneous code word of the underlying ECC. In this case, the memory controller attempts to decode the ECC of the code word by applying to the initial readout ECC hard decoding using any suitable hard decoding method, at a hard decoding step 112. At a hard decoding query step 116, the memory controller checks whether the hard decoding of step 112 has succeeded, and if so, provides the decoded code word to host 52. It is noted that using hard decoding at step is not mandatory. In alternative embodiments, soft decoding or a combination of hard decoding followed by soft decoding can also be used.

When at step 108 the initial readout is unbalanced, the initial readout may contain a code word having many errors. A hard decoding failure at step 116 may be caused due to reading the code word using an inaccurate initial RV or due to exceeding the decoding capability of the hard decoder. When the readout at step 108 is unbalanced or when the codeword is undecodable at step 116, the memory controller attempts to read the memory cells in the group using a default RV, at a default reading step 120. The default RV is specified by the vendor of the memory device and may be more accurate than the initial RV, e.g., when the initial RV was adjusted for another memory block. The readout of step 120 is denoted herein as a "default readout".

At a default imbalance calculation step 124, the memory controller calculates a default imbalance level of the default readout, and at a default balance query step 128 checks whether the default readout is balanced using a balance criterion. For example, the balance criterion may indicate that the default readout is balanced when the default imbalance level is below a specified default balance threshold.

When at step 128 the default readout is unbalanced, the memory controller marks the memory block as unusable, at a bad block marking step 132. In some embodiments, the default balance threshold of step 128 equals the initial balance threshold of step 108. In other embodiments, the default balance threshold of step 128 differs from (e.g., is lower than) the initial balance threshold of step 108. In some embodiments, when both the initial readout and the default readout are unbalanced, the memory controller identifies the memory block as defective (at step 132).

The method steps up to step 128 allow the memory controller to quickly decode the code word and identify an unusable memory block. When at step 128 the default readout is balanced, however, advanced decoding and recovery schemes are required such as soft decoding and/or a RAID scheme, as will be described below.

To maximize the probability of successful soft decoding, the memory controller first acquires an optimal RV value at an optimal RV acquiring step 136. The memory controller may acquire the optimal RV using any suitable method. In some embodiments, the value of the optimal RV results in the minimal number of errors in the resulting readout, and therefore the corresponding optimal readout is more likely to pass soft decoding, compared to producing the readout using any other RV value.

At an optimal readout step 140, the memory controller reads the code word from the group of memory cells using the optimal RV to produce the optimal readout. At an optimal imbalance calculation step 144, the memory controller calculates an optimal imbalance level of the optimal readout. The resulting optimal imbalance level may be used at a later stage, in classifying the memory block as usable or unusable after a RAID scheme has succeeded to recover the CW, as will be described below.

At a soft decoding step 148, the memory controller applies soft decoding to the optimal readout of step 140, using any suitable soft decoding method. Soft decoding typically requires multiple read operations using multiple RVs around the optimal RV. At a soft decoding query step 152, the memory controller checks whether the soft decoding of step 148 has succeeded, and if so, provides the decoded code word to host 52.

When at step 152, soft decoding has failed, it may still be possible to recover the error-free code word using a RAID scheme. To this end, at a RAID application step 156, the memory controller applies a suitable RAID scheme to recover the code word. In some embodiments the RAID scheme attempts to recover the code word based on redundancy information prestored, e.g., in the memory device. The RAID scheme may be applied, for example, at the code word level, memory block level, plane level or die level. In some embodiments, to apply the RAID scheme the CW needs to be re-read.

At a RAID query step 160, the memory controller checks whether the RAID scheme has succeeded. When the RAID scheme has failed, the code word cannot be recovered, and the memory controller marks the memory block as unusable, at a bad block marking step 164. Otherwise, the RAID scheme at step 160 has successfully reconstructed the code word, and the memory controller sends the reconstructed code word to the host.

In some embodiments, even when the RAID scheme has succeeded in recovering the code word, the underlying memory block may contain defects and therefore should be retired. At a block-classification step 168 the memory controller classifies the memory block as usable or unusable using one or more block classification criteria, which allows the memory controller to identify defect-driven memory blocks that could not be identified otherwise.

The block classification at step 168 may be carried out in various ways as described herein. In an embodiment, the memory controller calculates the number of bit differences (also referred to as "bit-flips") between the optimal readout of step 140 and the code word reconstructed by RAID. It is noted that since soft decoding at step 148 has failed, the number of bit-flips after RAID is expected to be relatively high. In this embodiment, when the number of bit-flips is below a first specified threshold number or the number of bit-flips is above a second higher specified threshold number the memory controller classifies the memory block as unusable. In some embodiments, at step 168 the memory controller may reread the CW using modified RV(s), e.g., using an RV acquiring procedure.

In another embodiment, at step 168 the memory controller classifies the memory block as unusable when the optimal imbalance level of step 144 exceeds a specified optimal balance threshold. In this case, the optimal imbalance level is too high for the soft decoding and the memory block should be retired even if the code word is recoverable using the RAID scheme.

In yet another embodiment, at step 168 the memory controller classifies the memory controller based on the initial and default imbalance levels of respective steps 104 and 124, and on the initial and default RVs used in respective steps 100 and 120. Let IMB_I and IMB_D denote the imbalance levels calculated at respective steps 104 and 124 and let RV_I and RV_D denote the RVs used at respective steps 100 and 120. Let IMB_ABS_DIFF denote the absolute imbalance difference, given by IMB_ABS_DIFF=ABS (IMB_I–IMB_D), and let RV_ABS_DIFF denote the absolute RV difference given by ABS(RV_I–RV_D). In some embodiments, the memory controller checks a condition given by IMB_ABS_DIFF>F1(RV_ABS_DIFF), wherein F1 denotes a monotonic increasing function. When this condition is met, the memory controller marks the memory block as unusable. The idea behind this embodiment is that a small difference between the RVs is expected to result in a small difference between the corresponding imbalance levels. In an example embodiment, the function F1 above is given by: F1=1–2·Q[RV_ABS_DIFF/(2*sigma)], wherein Q is the Gaussian Q-function, and sigma is the nominal standard deviation of the cell threshold voltage distribution after programming. Alternatively, other types of functions serving as the F1 function may also be used.

In further yet another embodiment, the classification criterion is designed to mitigate inconsistent quality failures. The inventors have encountered a failure mode in which the number of errors in repeating readouts from the same memory cells is initially high, and typically drops to a decodable level after several tens or hundreds of read operations. This may result in degrading user experience due to repeated invocation of the RAID scheme, as described above. It is noted that after a Program and Erase (P/E) cycle in which the memory block is erased and reprogramed, since programing employs high voltages, following verification the read operations may be initially successful, but after an idle period readout imbalance read failures are likely to occur. In the present embodiment, the classification criterion for marking an unusable memory block is met when the RAID scheme was invoked at least once in two successive P/E cycles of the same memory block. Alternatively, a more general criterion is met when the RAID scheme is invoked at least 'n' times in 'm' successive P/E cycles, wherein n and m are integers satisfying the relationship n<m.

In another example embodiment, at step 168 the memory controller marks a memory block as unusable in response to identifying that two or more different optimal readouts from that memory block are classified as unbalanced, in the same P/E cycle, or in different P/E cycles in which the memory block is typically programmed with different data.

Although the conditions at step 168 were described separately, these conditions may be combined logically in any suitable way, such as defining a high-level condition that combines two or more of the conditions using a logical OR operation, and/or using a logical AND operation.

Application to Memory Blocks Programmed in SLC Mode

The methods described above may be applied, for example, to memory blocks in which data is written in two programming levels, also known as a Single-Level Cell (SLC) mode.

In some embodiments, for fast programming in SLC mode, memory cells are programmed by applying a single programming pulse while omitting a program verification phase. In case of a word line short, the voltage of the applied programming pulse may be lower than required for fully programming the memory cells. Consequently, most of the memory cells in the word line (or even most of the memory block) may remain in the erased state. A readout of a code word retrieved from the memory cells may therefore contain all or mostly '1' bits. Repeated reads may, however, register this is not the case due to some weak residual programming or read disturb. Since RAID may reconstruct the failing code word with high probability, with no post RAID classification, the memory block is likely to be wrongly identified as usable.

In contrast, using the method of FIG. 2, a SLC memory block having a word line short is likely to be correctly identified as unusable or unusable at one of steps 132, 164 or 168, of the method of FIG. 2, as described above.

The embodiments described above are given by way of example, and other suitable embodiments can also be used. For example, in one embodiment, when the memory controller identifies that the optimal imbalance level is higher than a specified imbalance threshold, this may indicate that the optimal readout may fail soft decoding with high probability. In this case, the memory controller may skip soft decoding at step 148 and continue directly to apply the RAID scheme of step 156. Such shortcut processing is depicted in FIG. 2 by a dotted arrow line 172. In some embodiments, the soft decoding at step 148 includes multiple decoding techniques that may be applied in series and/or iteratively. For example, techniques of this sort may be used to improve accuracy of Log Likelihood Ratios (LLRs) used in soft decoding. In such embodiments, the memory controller may selectively execute a partial subset of these techniques, e.g., based on the severity of the optimal imbalance level.

In some embodiments, the memory controller sets the optimal balance threshold used in the post RAID classification step 168 to a lower value than the default balance threshold of step 128. It is noted that the default RV at step 128 may be significantly sub-optimal compared to the optimal RV acquired at step 136 and used at step 168. Therefore, the imbalance level with the optimal RV is more reliable than with the default RV, and a lower balance threshold can be used.

Although in the description above, the memory controller compares between the optimal imbalance level and the optimal balance level, at step 168, this is not mandatory. In alternative embodiments, this comparison may be carried out at step 144, and the comparison decision (balanced or unbalanced) may be flagged to be used at step 168.

In some embodiments the memory controller checks for RAID failures in multiple memory blocks. In such embodiments, upon detecting RAID failures occurring concurrently in multiple different memory blocks, the memory controller may indicate to the storage system to attempt additional mitigation methods such as, for example, applying a hard reset and/or marking a relevant plane or die as unusable.

Although the embodiments described herein mainly address storage systems that include a RAID scheme, e.g., based on NAND Flash or magnetic memory devices, the methods and systems described herein can also be used in other applications, such as in storage systems having no RAID support that may benefit from imbalance tests for identifying physical defects. Relevant nonvolatile memory types in such systems include, for example, RRAM, PCM and FRAM.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A storage apparatus, comprising:
  an interface, configured to communicate with a plurality of memory cells organized in multiple memory blocks; and
  storage circuitry, configured to:
    produce a given readout by reading data from a group of the memory cells in a given memory block, using a given read voltage;
    calculate a given zeros-ones imbalance level of the given readout;
    based on the given zeros-ones imbalance level, check whether the given readout level is zeros-ones balanced or unbalanced in accordance with a balance criterion; and
    upon detecting that the given readout is zeros-ones unbalanced, mark the given memory block as suspected of being unusable.

2. The storage apparatus according to claim 1, wherein the storage circuitry is configured to produce the given readout by reading the memory cells in the group using a default read voltage specified at production of a memory device comprising the plurality of memory cells.

3. The storage apparatus according to claim 1, wherein the storage circuitry is configured to check whether the given readout is zeros-ones balanced or unbalanced after: (i) producing an initial readout by reading the memory cells in the group using a read threshold that has been determined based on one or more previous read operations from the given memory block or from other memory blocks, and (ii) determining that the initial readout is zeros-ones unbalanced.

4. The storage apparatus according to claim 1, wherein the memory cells in the group store a Code Word (CW) of an Error Correction Code (ECC), and wherein the storage circuitry is configured to check whether the given readout is zeros-ones balanced or unbalanced after: (i) producing an initial readout by reading the memory cells in the group using a read threshold that has been determined based on previous read operations from the given memory block or from other memory blocks, (ii) applying hard decoding of the ECC to the initial readout when the initial readout is zeros-ones balanced, and (iii) identifying that the hard decoding has failed.

5. The storage apparatus according to claim 1, wherein the memory cells in the group store a Code Word (CW) of an Error Correction Code (ECC), and wherein the storage circuitry is configured to, upon detecting that the given readout is zeros-ones balanced,
  acquire an optimal read voltage;
  read the memory cells in the group using the acquired optimal read voltage to produce an optimal readout;
  calculate an optimal zeros-ones imbalance level of the optimal readout;
  apply soft decoding of the ECC to the optimal readout; and
  upon detecting that the soft decoding has failed, apply to at least part of the given memory block a Redundant Array of Independent Disks (RAID) scheme to recover the CW.

6. The storage apparatus according to claim 5, wherein the storage circuitry is configured to mark the given memory block as unusable upon detecting that the RAID scheme has failed.

7. The storage apparatus according to claim 5, wherein the storage circuitry is configured to, in response to detecting that the RAID scheme has succeeded to recover the CW, mark the given memory block as unusable upon identifying that a number of errors in the optimal readout is below a first specified error-count threshold or above a second higher specified error-count threshold.

8. The storage apparatus according to claim 5, wherein the storage circuitry is configured to, in response to detecting that the RAID scheme has succeeded to recover the CW, mark the given memory block as unusable upon detecting, based on the optimal zeros-ones imbalance level, that the optimal readout is zeros-ones unbalanced.

9. The storage apparatus according to claim 5, wherein the storage circuitry is configured to, in response to detecting that the RAID scheme has succeeded to recover the CW, mark the given memory block as unusable upon detecting that an absolute difference between the given zeros-ones imbalance level and the optimal zeros-ones imbalance level is higher than a difference threshold that depends on an absolute difference between the given read threshold and the optimal read voltage.

10. The storage apparatus according to claim 5, wherein the storage circuitry is configured to, in response to detecting that the RAID scheme has succeeded to recover the CW, mark the given memory block as unusable upon detecting that the RAID scheme has been invoked at least a specified number of times in multiple successive Program and Erase (P/E) cycles applied to the given memory block.

11. A method for data storage, comprising:
  in a storage apparatus comprising a plurality of memory cells organized in multiple memory blocks,
  producing a given readout by reading data from a group of the memory cells in a given memory block, using a given read voltage;
  calculating a given zeros-ones imbalance level of the given readout;
  based on the given zeros-ones imbalance level, checking whether the given readout level is zeros-ones balanced or unbalanced in accordance with a balance criterion; and
  upon detecting that the given readout is zeros-ones unbalanced, marking the given memory block as suspected of being unusable.

12. The method for data storage according to claim 11, wherein producing the given readout comprises reading the memory cells in the group using a default read voltage specified at production of a memory device comprising the plurality of memory cells.

13. The method for data storage according to claim 11, wherein checking whether the given readout level is zeros-ones balanced or unbalanced comprises checking whether the given readout is zeros-ones balanced or unbalanced after: (i) producing an initial readout by reading the memory cells in the group using a read threshold that has been determined based on one or more previous read operations from the given memory block or from other memory blocks, and (ii) determining that the initial readout is zeros-ones unbalanced.

14. The method for data storage according to claim 11, wherein the memory cells in the group store a Code Word (CW) of an Error Correction Code (ECC), and wherein checking whether the given readout level is zeros-ones balanced or unbalanced comprises checking whether the given readout is zeros-ones balanced or unbalanced after: (i) producing an initial readout by reading the memory cells in the group using a read threshold that has been determined based on previous read operations from the given memory block or from other memory blocks, (ii) applying hard decoding of the ECC to the initial readout when the initial readout is zeros-ones balanced, and (iii) identifying that the hard decoding has failed.

15. The method for data storage according to claim 11, wherein the memory cells in the group store a Code Word (CW) of an Error Correction Code (ECC), and comprising, upon detecting that the given readout is zeros-ones balanced,
  acquiring an optimal read voltage;
  reading the memory cells in the group using the acquired optimal read voltage to produce an optimal readout;
  calculating an optimal zeros-ones imbalance level of the optimal readout;

applying soft decoding of the ECC to the optimal readout; and upon detecting that the soft decoding has failed, applying to at least part of the given memory block a Redundant Array of Independent Disks (RAID) scheme to recover the CW.

16. The method for data storage according to claim 15, and comprising, marking the given memory block as unusable upon detecting that the RAID scheme has failed.

17. The method for data storage according to claim 15, and comprising, in response to detecting that the RAID scheme has succeeded to recover the CW, marking the given memory block as unusable upon identifying that a number of errors in the optimal readout is below a first specified error-count threshold, or above a second higher specified error-count threshold.

18. The method for data storage according to claim 15, and comprising, in response to detecting that the RAID scheme has succeeded to recover the CW, marking the given memory block as unusable upon detecting, based on the optimal zeros-ones imbalance level, that the optimal readout is zeros-ones unbalanced.

19. The method for data storage according to claim 15, and comprising, in response to detecting that the RAID scheme has succeeded to recover the CW, marking the given memory block as unusable upon detecting that an absolute difference between the given zeros-ones imbalance level and the optimal zeros-ones imbalance level is higher than a difference threshold that depends on an absolute difference between the given read threshold and the optimal read voltage.

20. The method for data storage according to claim 15, and comprising, in response to detecting that the RAID scheme has succeeded to recover the CW, marking the given memory block as unusable upon detecting that the RAID scheme has been invoked at least a specified number of times in multiple successive Program and Erase (P/E) cycles applied to the given memory block.

* * * * *